(12) United States Patent
Ishikawa et al.

(10) Patent No.: US 7,045,771 B2
(45) Date of Patent: May 16, 2006

(54) LIGHT BEAM SCANNING APPARATUS AND IMAGE FORMING APPARATUS

(75) Inventors: Daisuke Ishikawa, Sunto-gun (JP); Koji Tanimoto, Tagata-gun (JP); Kenichi Komiya, Kawasaki (JP); Yuji Inagawa, Numazu (JP)

(73) Assignees: Kabushiki Kaisha Toshiba, Tokyo (JP); Toshiba TEC Kabushiki Kaisha, Tokyo (JP)

( * ) Notice: Subject to any disclaimer, the term of this patent is extended or adjusted under 35 U.S.C. 154(b) by 77 days.

(21) Appl. No.: 10/800,627

(22) Filed: Mar. 16, 2004

(65) Prior Publication Data

US 2005/0205769 A1  Sep. 22, 2005

(51) Int. Cl.
*H01J 3/14* (2006.01)
*B41J 2/435* (2006.01)

(52) U.S. Cl. ............ 250/234; 250/236; 347/237; 347/246; 347/250

(58) Field of Classification Search .......... 250/234, 250/235, 236; 347/235–238, 246, 248, 250
See application file for complete search history.

(56) References Cited

U.S. PATENT DOCUMENTS

| 6,344,866 B1 * | 2/2002 | Komiya et al. .......... 347/133 |
| 6,509,921 B1 * | 1/2003 | Komiya et al. .......... 347/235 |
| 6,549,265 B1 | 4/2003 | Sakakibara et al. |

FOREIGN PATENT DOCUMENTS

| JP | 2001-88344 A | 4/2001 |
| JP | 2002-307751 A | 10/2002 |

\* cited by examiner

*Primary Examiner*—Kevin Pyo
(74) *Attorney, Agent, or Firm*—Foley & Lardner LLP

(57) ABSTRACT

According to an aspect of the present invention, a light beam scanning apparatus comprises light emitting unit for emitting a light beam, scanning control unit for controlling scanning of the light beam, light quantity detecting unit for detecting the quantity of light in the light beam, light quantity control signal output unit for outputting a light quantity control signal that performs control such that the quantity of light in the light beam is kept fixed on the basis of a result of detection of the quantity of light in the light beam, and light emission control unit for controlling a light emission timing for the light beam on the basis of image data and controlling the quantity of light in the light beam on the basis of the light quantity control signal while the light emission timing is being controlled.

8 Claims, 13 Drawing Sheets

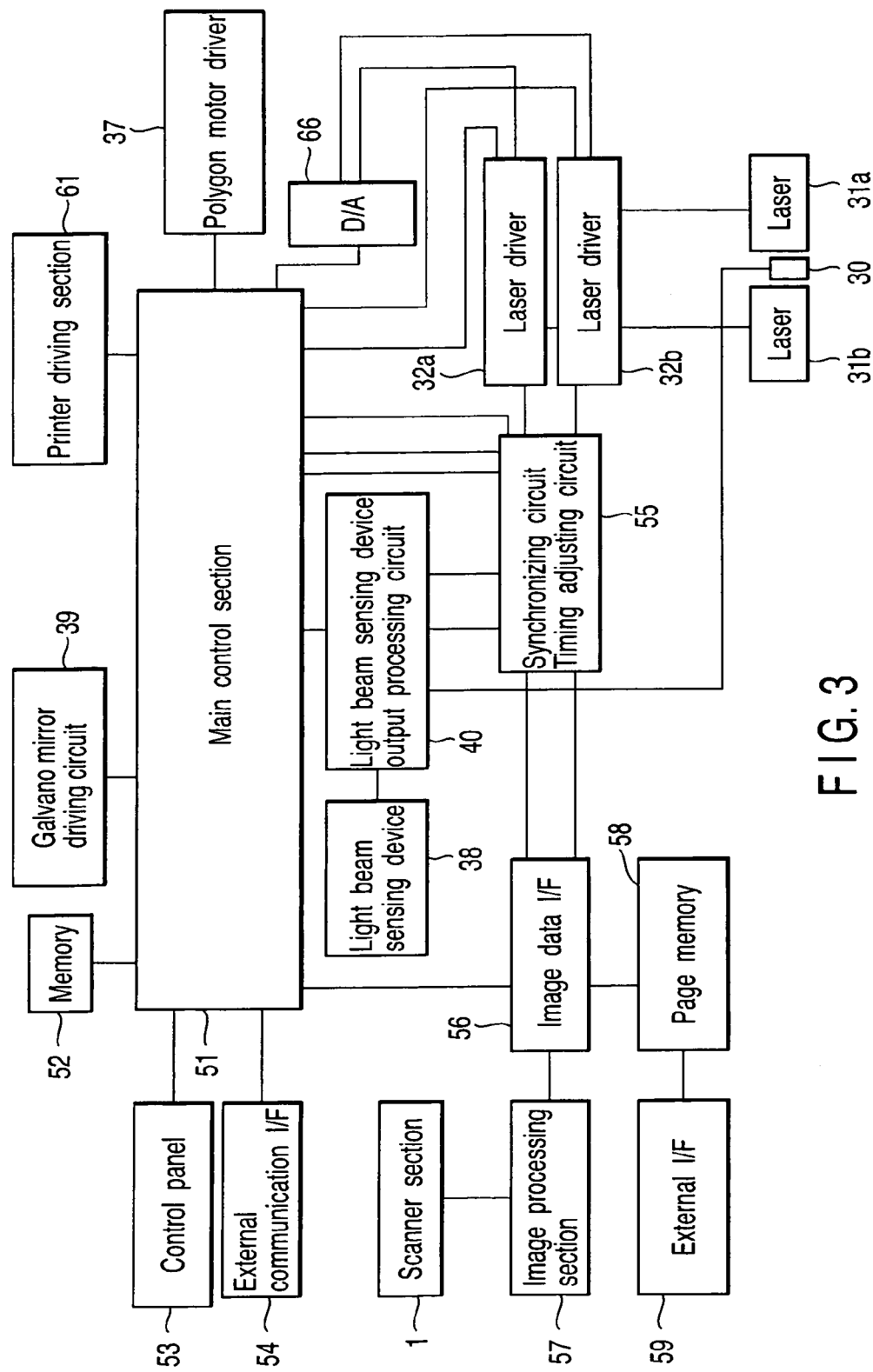
F I G. 3

APC signal (ideal)

APC signal (actual)

Corrected APC signal

FIG. 8A
Odd-line image data
Even-line image data

FIG. 8B
Two-beam individual system { APC-1, APC-2 }

FIG. 8C
Two-beam array system { APC-1, APC-2 }

FIG. 8D
Two-beam individual system { APC-1, APC-2 }

FIG. 8E
Two-beam array system { APC-1, APC-2 }

LIGHT BEAM SCANNING APPARATUS AND IMAGE FORMING APPARATUS

BACKGROUND OF THE INVENTION

1. Field of the Invention

The present invention relates to a light beam scanning apparatus that scans a light beam based on image data, over a photosensitive drum. The present invention also relates to an image forming apparatus to which the light beam scanning apparatus is applied.

2. Description of the Related Art

In a conventional image forming apparatus, a laser driving circuit causes a laser to emit a light beam by supplying a specified DC current (bias current) to a laser and in addition to this current supply, supplying a switch current that is switched in accordance with image data. If the laser is supplied only with a current that does not exceed a threshold current, the laser does not emit a light beam. The laser emits only faint diffuse light with a varying phase. The quantity of light in the faint diffuse light is much smaller than that in the light beam emitted by the laser supplied with a current exceeding the threshold current. To allow the laser to emit a light beam, it is necessary to supply a current exceeding a predetermined criterion for the internal energy of the laser. Thus, the emission of a light beam can be controlled by supplying the laser with a current not exceeding the threshold current and then slightly increasing or reducing the current compared with the supplied current.

The time from the start of supply of a switch current to the laser already supplied with a bias current until the switch current exceeds the predetermined criterion for the internal energy of the laser is shorter than the time from the start of supply of a required current to the laser supplied with no bias current until the switch current exceeds the predetermined criterion for the internal energy of the laser. Thus, pre-supplying the laser with a bias current improves the emission characteristics of a light beam from the laser. This is why conventional laser driving circuits apply a bias current to the laser.

As described above, the laser element is characterized in that the quantity of light emitted by the element varies in proportion to the supplied current. Accordingly, by controlling the current supplied to the laser, it is possible to control the quantity of light emitted by the laser to form an image. Auto power control (APC) is known to maintain a fixed laser power.

APC maintains a fixed laser power by using a photodiode built into the laser to detect the quantity of light emitted by the laser, comparing this detection signal with a reference value that is a target value for laser power, and then increasing or reducing the current supplied to the laser.

APC is performed while the laser is actually emitting light. Thus, APC cannot be performed during the formation of an image (in an image area) with no fixed emission patterns. That is, APC is basically performed outside the image area. One horizontal line of image is formed using a light beam emitted by the laser in association with laser power based on the results of APC performed outside the image area.

Furthermore, the laser has a temperature characteristic called droop. The laser is an element that emits light the quantity of which varies with the current supplied. Strictly speaking, however, the variation in the quantity of light is affected not only by the current supplied but also by the temperature. Accordingly, even when the same current is supplied to the laser, the quantity of light emitted varies depending on the temperature of the laser. Specifically, if APC is performed outside the image area and a specific current is continuously supplied to the laser to cause the laser to emit a light beam to form one horizontal line of image, then strictly speaking, the quantity of light in the light beam varies between the former half and latter half of the horizontal line. This is because when the laser emits light, the temperature of the laser itself increases to reduce the quantity of light from the laser.

If an image forming speed is relatively slow, the laser provides a relatively low power and there is a sufficient amount of time to store charges in a capacitor. Accordingly, the impact of droop is relatively small and no serious problems occur. However, as the image forming speed increases and an exposure system is changed from normal underfield scan to overfield scan, an increasingly high laser power is required. As the laser power becomes higher, there is a smaller amount of time to store charges in the capacitor and the impact of droop becomes more marked. Furthermore, a significant variation in the quantity of light from the laser occurs within one horizontal line. Consequently, the resulting image density may be affected. Specifically, the start of the scanning direction (one horizontal line) in which a photosensitive member is scanned is markedly affected by droop, whereas its end is insignificantly affected by droop.

For example, Jpn. Pat. Appln. KOKAI Publication No. 2002-307751 discloses a technique executed before recording image data to measure the time for which image data requires almost continuous lighting, to compare the measured time with a predetermined reference time, and if the continuous lighting time is longer than the reference time, to perform ACP different from the normal one.

As described above, with conventional APC, the density varies along the scanning direction owing to droop. As a result, image quality may be degraded.

BRIEF SUMMARY OF THE INVENTION

It is an object of the present invention to provide a light beam scanning apparatus that enables the formation of an image with high quality. It is another object of the present invention to provide an image forming apparatus that enables the formation of an image with high quality.

According to an aspect of the present invention, a light beam scanning apparatus comprises light emitting means for emitting a light beam, scanning control means for controlling scanning of light beam emitted by the light emitting means, light quantity detecting means for detecting the quantity of light in the light beam emitted by the light emitting means, light quantity control signal output means for outputting a light quantity control signal that performs control such that the quantity of light in the light beam emitted by the light emitting means is kept fixed on the basis of a result of detection of the quantity of light in the light beam executed by the light quantity detecting means, and light emission control means for controlling a light emission timing for the light beam from the light emitting means on the basis of image data and controlling the quantity of light in the light beam emitted by the light emitting means on the basis of the light quantity control signal while the light emission timing is being controlled.

According to an aspect of the present invention, a light beam scanning apparatus comprises light emitting means for emitting a light beam, scanning control means for controlling scanning of the light beam by subjecting the light beam to a conformal speed motion, converting means for allowing the light beam to pass through to convert the conformal rate motion of the light beam into a uniform rate motion, and light quantity control means for controlling the quantity of light in the light beam emitted by the light emitting means on the basis of a transmittance of the converting means so that the quantity of light in the light beam emitted by the light emitting means which quantity is varied by the effect of the transmittance is kept fixed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the embodiments given below, serve to explain the principles of the invention.

FIG. 3 is a diagram showing an example of a light beam scanning apparatus employing an array system in which one photodiode is provided for a plurality of lasers so as to detect light emitted by each of the lasers;

FIG. 8A is a timing chart showing odd line image data and even line image data;

FIG. 8B is a timing chart of APC signals output by the light beam scanning apparatus based on the individual system in association with the image data shown in FIG. 8A;

FIG. 8C is a timing chart of APC signals output by the light beam scanning apparatus based on the array system in association with the image data shown in FIG. 8A;

FIG. 8D is a timing chart of APC signals (corrected APC signals corrected taking the minimum continuous light emission period t7 into account) output by the light beam scanning apparatus based on the individual system in association with the image data shown in FIG. 8A;

FIG. 8E is a timing chart of APC signals (corrected APC signals corrected taking the minimum continuous light emission period t7 into account) output by the light beam scanning apparatus based on the array system in association with the image data shown in FIG. 8A;

DETAILED DESCRIPTION OF THE INVENTION

A first embodiment of the present invention will be described below with reference to the drawings.

Figure 1:
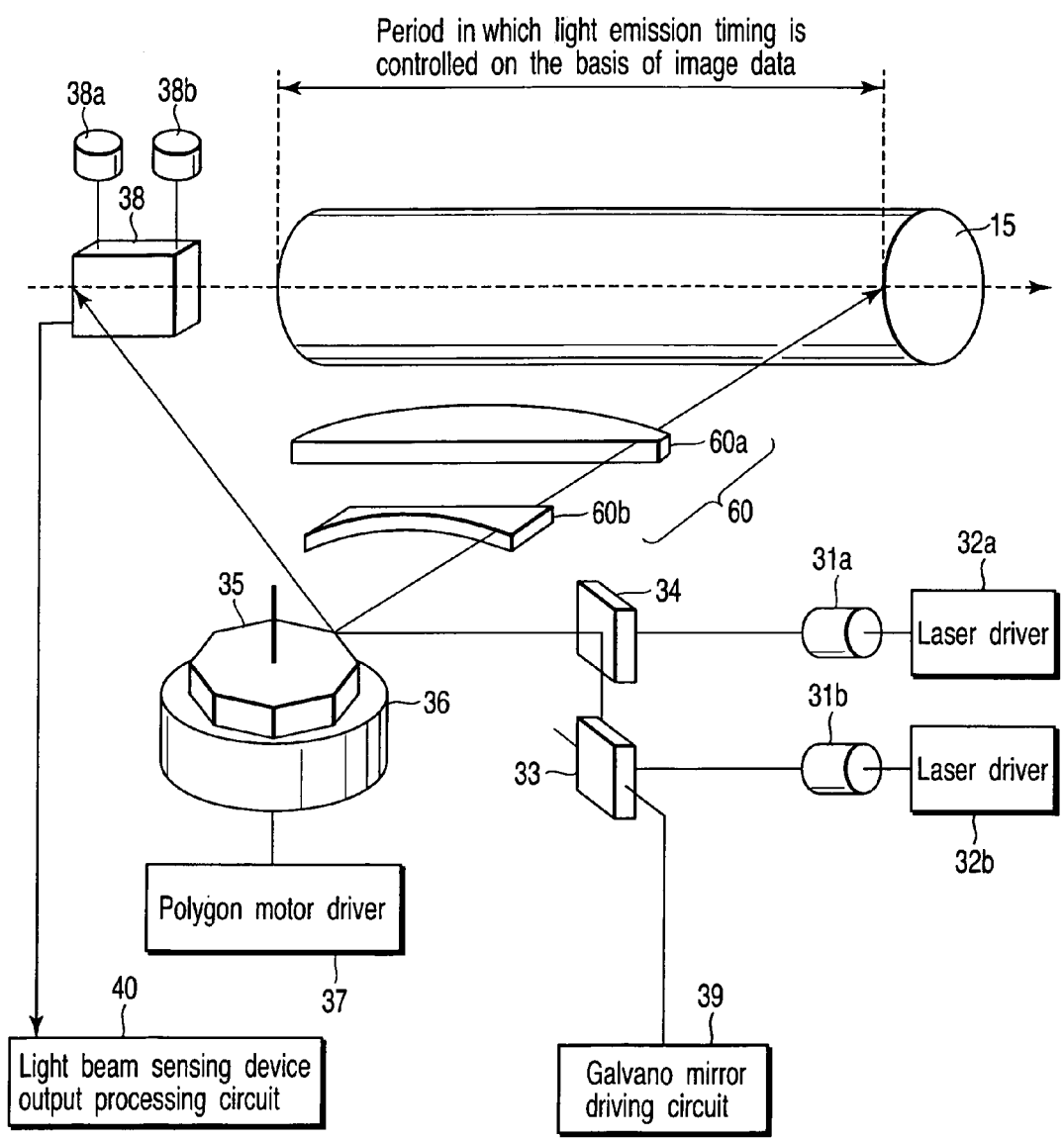
FIG. 1 is a view schematically showing the configuration of a light beam scanning apparatus and also showing the positional relationship between the light beam scanning apparatus and a photosensitive drum.

FIG. 1 is a view schematically showing the configuration of a light beam scanning apparatus and also showing the positional relationship between the light beam scanning apparatus and a photosensitive drum. In the first embodiment, description will be focused on a light beam scanning apparatus comprising a plurality of semiconductor laser oscillators (for example, two semiconductor laser oscillators) that emit the respective light beams (for example, two light beams), that is, a multibeam light scanning apparatus. However, the present invention is not limited to the multibeam light beam scanning apparatus. For example, the present invention is applicable to a light beam scanning apparatus comprising one semiconductor laser oscillator, that is, a single-beam light beam scanning apparatus. Naturally enough, for light quantity control (described later in detail) performed taking light emission timings for a plurality of light beams from a plurality of semiconductor laser oscillators into account, the present invention is applicable to a multibeam light beam scanning apparatus.

As shown in FIG. 1, the light beam scanning apparatus has laser oscillators 31a and 32b built in as two light emitting means (light sources). The laser oscillators 31a and 31b simultaneously form the respective scanning lines of images to enable image formation at high speed without extremely increasing the rotation speed of a polygon mirror.

Specifically, the laser oscillator 31a is driven by a laser driver 32a operating as light emission control means. An output laser beam passes through a collimator lens (not shown) and then a half mirror 34. Then, the laser beam is incident on a polygon mirror 35 operating as a polyhedral rotating mirror.

The polygon mirror 35, operating as scanning control means, is rotated by a polygon motor 36 driven by a polygon motor driver 37. Thus, light reflected by the polygon mirror 35 is scanned in a fixed direction at an angular speed determined by the rotation speed of the polygon mirror 36. The light beam scanned by the polygon mirror 35 passes through (is transmitted through) an fθ lens 60 operating as converting means for converting the conformal rate motion of the light beam into a uniform rate motion. The light beam then passes through the fθ lens 60 to scan, at a fixed speed, a light receiving surface of a light beam scanning device 38 and a photosensitive drum 15 operating as an image carrier.

The laser oscillator 31b is driven by a laser driver 32b. An output light beam passes through a collimator lens (not shown) and is reflected by a galvano mirror 33 and then by the half mirror 34. The reflected light from the half mirror 34 is incident on the polygon mirror 35. The following the polygon mirror 35 is the same as that for the laser oscillator 31a. The laser beam passes through the fθ lens 60 to scan, at a fixed speed, the light receiving surface of a light beam scanning device 38 and the photosensitive drum 15, operating as an image carrier.

The laser drivers 32a and 32b have respective auto power control (APC) circuits built in to allow the laser oscillators 31a and 31b, respectively, to emit light at a light emission power level set by a main control section (CPU) 51, described later. That is, the APC circuits and the main control section 51 also function as light quantity control means.

In this manner, the light beams output by the respective laser oscillators 31a and 31b are synthesized by the half mirror 34. Consequently, the two light beams advance toward the polygon mirror 35.

Therefore, the two light beams can be simultaneously scanned over the photosensitive drum 15.

The galvano mirror 33 adjusts (controls) the positional relationship between the light beams in a sub-scanning direction. A galvano mirror driving circuit 39 is connected to the galvano mirror 33.

The light beam sensing device 38, operating as light quantity sensing means, senses the passing positions, passing timings, and powers of the two light beams. The light beam sensing means 38 is disposed near an end of the photosensitive drum 15 so that its light receiving surface is equivalent to a surface of the photosensitive drum 15. On the basis of a detection signal from the light beam sensing device 38, the galvano mirror 33 is controlled to deal with the respective light beams (the position at which an image is formed in the sub-scanning direction is controlled), the light emission powers (intensities) of the laser oscillators 31a and 31b are controlled, and the light emission timings are controlled (the position at which an image is formed in a main scanning direction is controlled) (these controls will be described later in detail). A light beam sensing device output processing circuit 40 is connected to the light beam sensing device 38 to generate signals that provide these controls.

Now, a control system will be described with reference to FIGS. 2 and 3. A digital copier or the like to which the light beam scanning apparatus shown in FIG. 1 is applied employs multiple beams in order to, for example, increase an operating speed and a definition. The configuration of the light beam scanning apparatus employing multiple beams is roughly classified into two types. For example, an individual system has one photodiode provided for each laser so that each photodiode can detect light emitted by the corresponding laser, and an array system has one photodiode provided for a plurality of lasers so as to detect light emitted by these lasers.

Figure 2:
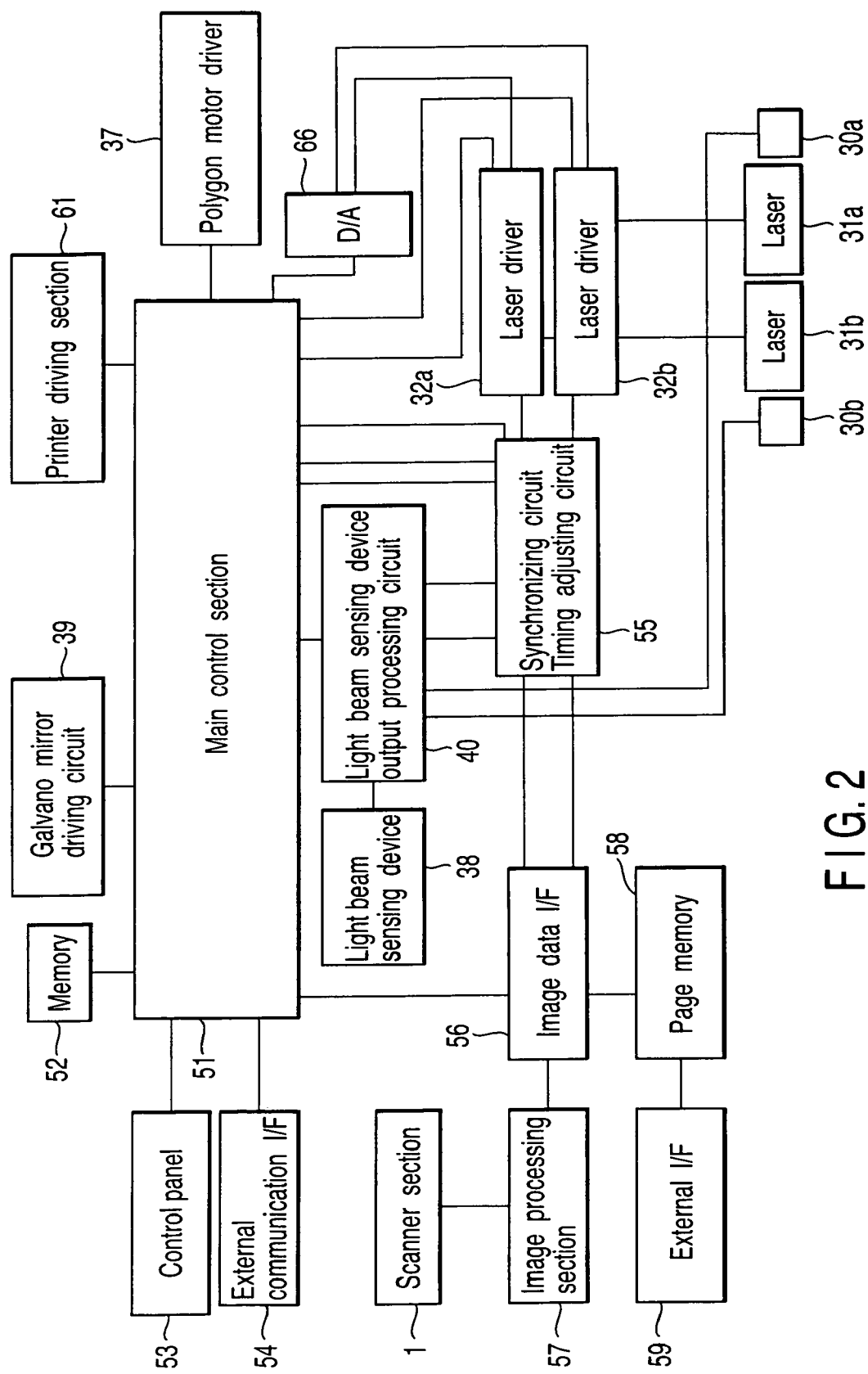
FIG. 2 is a diagram showing an example of a light beam scanning apparatus employing an individual system in which one photodiode is provided for each laser so that each photodiode can detect light emitted by the corresponding laser.

FIG. 2 is a diagram showing an example of a light beam scanning apparatus employing the individual system in which one photodiode is provided for each laser so that each photodiode can detect light emitted by the corresponding laser. Specifically, as shown in FIG. 2, a photodiode 30a is provided for a laser oscillator 31a as light quantity detecting means. A photodiode 30b is provided for a laser oscillator 31b as light quantity detecting means. The photodiode 30a detect light emitted by the laser oscillator 31a. The photodiode 30b detect light emitted by the laser oscillator 31b.

FIG. 3 is a diagram showing an example of a light beam scanning apparatus employing the array system in which one photodiode is provided for a plurality of lasers so as to detect light emitted by each of the lasers. Specifically, a photodiode 30 is provided for the laser oscillators 31a and 31b. The photodiode 30 detects light emitted by the laser oscillators 31a and 31b.

As described above, the present invention is not limited to the light beam scanning apparatus employing the individual system or the light beam scanning apparatus employing the array system. For example, the present invention is applicable to a single-beam light beam scanning apparatus.

Now, the common parts of FIGS. 2 and 3 will be described. The main control section is responsible for the whole control and includes, for example, a CPU. The main control section 51 connects to a memory 52, a control panel 53, and an external communication interface (I/F) 54, and to the laser drivers 32a and 32b via a digital-to-analog converter 66. The main control section 51 also connects to the polygon mirror motor driver 37, the galvano mirror driving circuit 39, the light beam sensing device output processing circuit 40, a synchronizing circuit (timing adjusting circuit) 50, an image data interface (I/F) 56, and a printer driving section 61.

An image data I/F 56 is connected to the synchronizing circuit 55. An image processing section 57 and a page memory 58 are connected to the image data I/F 56. A scanner section 1 is connected to the image processing section 57. An external interface (I/F) 59 is connected to the page memory 58.

Now, a brief description will be given of the flow of image data forming an image. The flow is as described below.

First, in the case of a copying operation, an image of a document is read by a scanner section 1 and transmitted to the image processing section 57. The image processing section 57 executes a predetermined process on an image signal from the scanner section 1.

Image data from the image processing section 57 is transmitted to the image data I/F 56. The image data I/F 56 serves to distribute the image data to the two laser drivers 32a and 32b.

The synthesizing circuit 55 generates a clock synchronizing with the passage of each light beam over the light beam sensing device 38. Synchronizing with the clock, the synchronizing circuit 55 dispatches the image data from the image data I/F 56 to the laser drivers 32a and 32b as laser modified signals.

When the image is thus transferred while synchronizing with the scanning of each light beam, a latent image is formed on the photosensitive drum 15 so as to be synchronized in the main scanning direction (at the correct position).

The printer driving section 61 forms a print image on a predetermined sheet on the basis of the latent image on the photosensitive drum 15.

The synchronizing circuit 55 also includes a sample timer for controlling the power of each light beam while the laser oscillators 31a and 31b are forced to emit light in a non-image area, and a drum light emission inhibiting timer that prevents the photosensitive drum 15 from being exposed to the light beams by forced light emission carried out by the main control section 51 if the control of the passing (scanning) position of each light beam and the control of the light beam powers of the light beams are performed, described later.

The control panel 53 is a man-machine interface that activates a copying operation, sets the number of sheets, and performs other operations.

The present digital copier is configured to not only perform a copying operation but also form and output image data externally input via the external I/F 59, connected to the page memory 58.

Furthermore, if the present digital copier is externally controlled via a network, the external communication I/F 54 serves as the control panel 53.

The galvano mirror driving circuit 39 drives the galvano mirror 33 in accordance with an instruction value from the main control section 51. Accordingly, the main control section 51 can freely control the angle of the galvano mirror 33 via the galvano mirror driving circuit 39.

The polygon motor driver 37 drives the polygon motor 36, which rotates the polygon mirror 35, which scans the two light beams as described previously. The main control section 51 can cause the polygon motor driver 37 to start and stop rotation and to change the rotation speed. The rotation speed is changed when the recording pitch (resolution) is changed.

The laser drivers 32a and 32b allow laser beams to be emitted in accordance with the previously described laser modulated signal, generated by the synchronizing circuit 55 and synchronizing with the scanning of the light beams. The laser drivers 32a and 32b also have a function of forcing the laser oscillators 31a and 31b to emit light regardless of image data in accordance with a forced light mission signal from the main control section 51.

This function is used to check the operational state of each of the laser oscillators 31a and 31b. It is also used to force the laser oscillators 31a and 31b to emit light so that each light beam is scanned over the light beam sensing device 38, when performing the control of the passing (scanning) positions of the light beams, described later, or the control of power of each light beam. However, as described previously, the drum light emission inhibiting timer in the synchronizing circuit 55 can prevent the photosensitive drum 15 from being exposed.

Furthermore, the main control section 51 sets the powers of lights emitted by the laser oscillators 31a and 31b, for the laser drivers 32a and 32b, respectively. The settings of the light emission powers are changed in accordance with a change in process conditions, the sensed passing positions of the light beams, and the like.

The memory stores information required for control. For example, by storing the magnitude of control of the galvano mirror, circuit characteristics (the offset value of an amplifier) required to sense the passing positions of the light beams, print area information corresponding to each light beam, and the like, it is possible to make the light beam scanning apparatus ready for image formation immediately after the power supply has been turned on.

Now, APC will be described. As described above, as the image forming speed increases and the exposure system is changed from underfield scan to overfield scan, an increasingly high laser power is required. As the laser power becomes higher, the impact of droop becomes more serious, and a significant variation in the quantity of light from the laser occurs within one horizontal line. Consequently, the resulting image density may be affected.

Description will be given below of APC applied to a single-beam light beam scanning apparatus, APC applied to a multibeam light beam scanning apparatus employing the individual system as shown in FIG. 2, and APC applied to a multibeam light beam scanning apparatus employing the array system as shown in FIG. 3. The single-beam light beam scanning apparatus is assumed to comprise one laser oscillator 31, one photodiode 30 corresponding to the laser oscillator 31, and one laser driver 32 that drives the laser oscillator 31.

First, description will be given of the APC applied to a single-beam light beam scanning apparatus. The single-beam light beam scanning apparatus outputs an APC signal (light quantity control signal) corresponding to image data, for example, as shown in the upper part of FIG. 4. Specifically, the main control section 51 outputs an APC signal that performs control such that the laser oscillator 31 emits light of a fixed quantity, on the basis of the result of detection of the quantity of light in the light beam carried out by the photodiode 30, provided for the laser oscillator 31. That is, the main control section 51 outputs an APC signal in association with a light emission timing for the laser oscillator 31 based on the image data. The APC signal output by the main control section 51 is input to an APC circuit built into the laser driver 32.

In particular, the main control section 51 outputs APC signals in association with continuous light emission periods which correspond to the image data and which last a predetermined period (t0) or longer. Specifically, the main control section 51 outputs APC signals in association with light emission periods t1 (>t0) and t2 (>0) correspond to the image data. This serves to reduce a variation in droop within an image area (one line) (suppress the impact of droop) and thus a variation in density on the image, as shown in the lower part of FIG. 4. In particular, with attention paid to continuous light emissions from the laser oscillator 31 which last a predetermined period or longer, APC signals are output in association with continuous light emission periods lasting the predetermined period or longer. Thus, adequate effects are produced by the APC corresponding to the image area.

Figure 4:
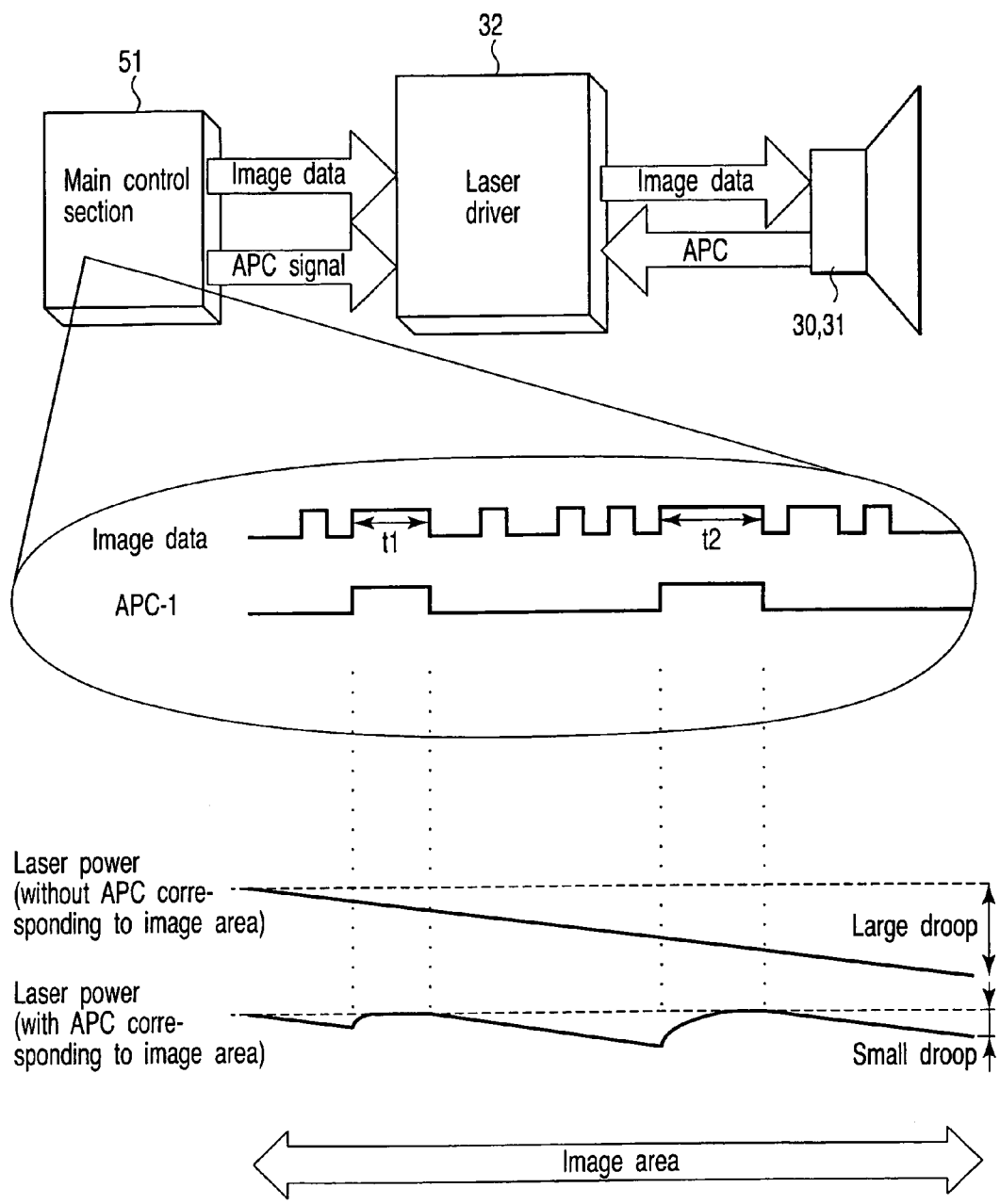
FIG. 4 is a view illustrating APC corresponding to image data.

The lower part of FIG. 4 shows a variation in laser power between the case in which APC is not performed in association with the image area (one line) and the case in which APC is performed in association with the image area (one line). As shown in the lower part of FIG. 4, if APC is not performed in association with the image area, then the variation in droop within the image area (one line) increases gradually. In contrast, if APC is performed in association with the image area, then the variation in droop within the image area (one line) decreases (the impact of droop is suppressed) to reduce the variation in density on the image.

If light from the laser covers the entire area of the one line and APC is performed during this light emission period, then it is theoretically possible to provide the entire area of the one line with a light beam of the same power. If no area of the one line needs to be exposed to light, that is, no image is to be formed, APC does not matter.

Furthermore, if light is emitted in association with only a small area of the one line (the light emission period is short), the laser generates only a small amount of heat. Accordingly, the temperature of the laser rises only slightly. Thus, the impact of droop is insignificant. That is, if light is emitted in association with only a large area of the one line (the light emission period is long), that is, light is continuously emitted, adequate effects are produced by APC corresponding to APC.

Figure 5A:
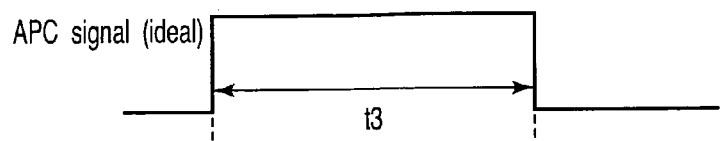
FIGS. 5A and 5B are diagrams illustrating the characteristics of an APC signal.
Figure 5B:
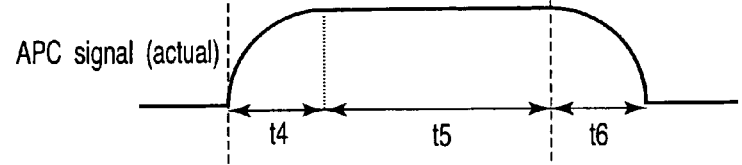
Figure 5C:
FIG. 5C is a diagram showing an example of a corrected APC signal corrected taking the characteristics of APC signals into account.

Now, the characteristics of the APC signal will be described with reference to FIGS. 5A, 5B, and 5C. FIG. 5A is a diagram showing the waveform of an ideal APC signal. FIG. 5B is a diagram showing the waveform of an actual APC signal. FIG. 5C is a diagram showing the waveform of a corrected APC signal corrected taking the characteristics of APC signals into account. The corrected APC signal corrected taking the characteristics of APC signals into account is applicable to a single-beam light beam scanning apparatus, a multibeam light beam scanning apparatus based on the individual system, and a multibeam light beam scanning apparatus based on the array system.

Ideally, the APC signal shown in FIG. 5A is supplied to the laser drivers. However, actually, the APC signal shown in FIG. 5B is supplied owing to a delay in the signal or the impact of tr and tf characteristics of the main control section 51. The APC is applied to the APC signal shown in FIG. 5B, in association with its effective range t5. That is, a delay t4 and an overtime t6 occur. The delay t4 prevents APC from being applied when it is required. The overtime t6 causes APC to be applied when it is not required. These delay and overtime characteristics of the APC signal may disadvantageously reduce the accuracy of APC.

Thus, the main control section 51 outputs the APC signal shown in FIG. 5C, with reference to image data accumulated in the page memory 58. Specifically, the main control section 51 outputs a corrected signal corrected on the basis of the characteristics of APC signals. As shown in FIG. 5C, the output of the corrected APC signal is started a time t4 before the laser starts emitting light in association with the image data. The output is stopped (starts to be stopped) a time t6 before the laser is deactivated in association with the image data.

To utilize the corrected APC signal shown in FIG. 5C, it is necessary that the laser light emission period corresponding to the image data is longer than a minimum continuous light emission period t7 (=t4+t6). Before the laser starts emitting light in association with the image data, the main control section 51 detects a continuous light emission period longer than the minimum continuous light emission period. The main control section 51 then outputs a corrected APC signal in association with the detected continuous light emission period.

Now, description will be given of APC applied to a multibeam light beam scanning apparatus employing the individual system as shown in FIG. 2 and APC applied to a multibeam light beam scanning apparatus employing the array system as shown in FIG. 3.

Figure 6:
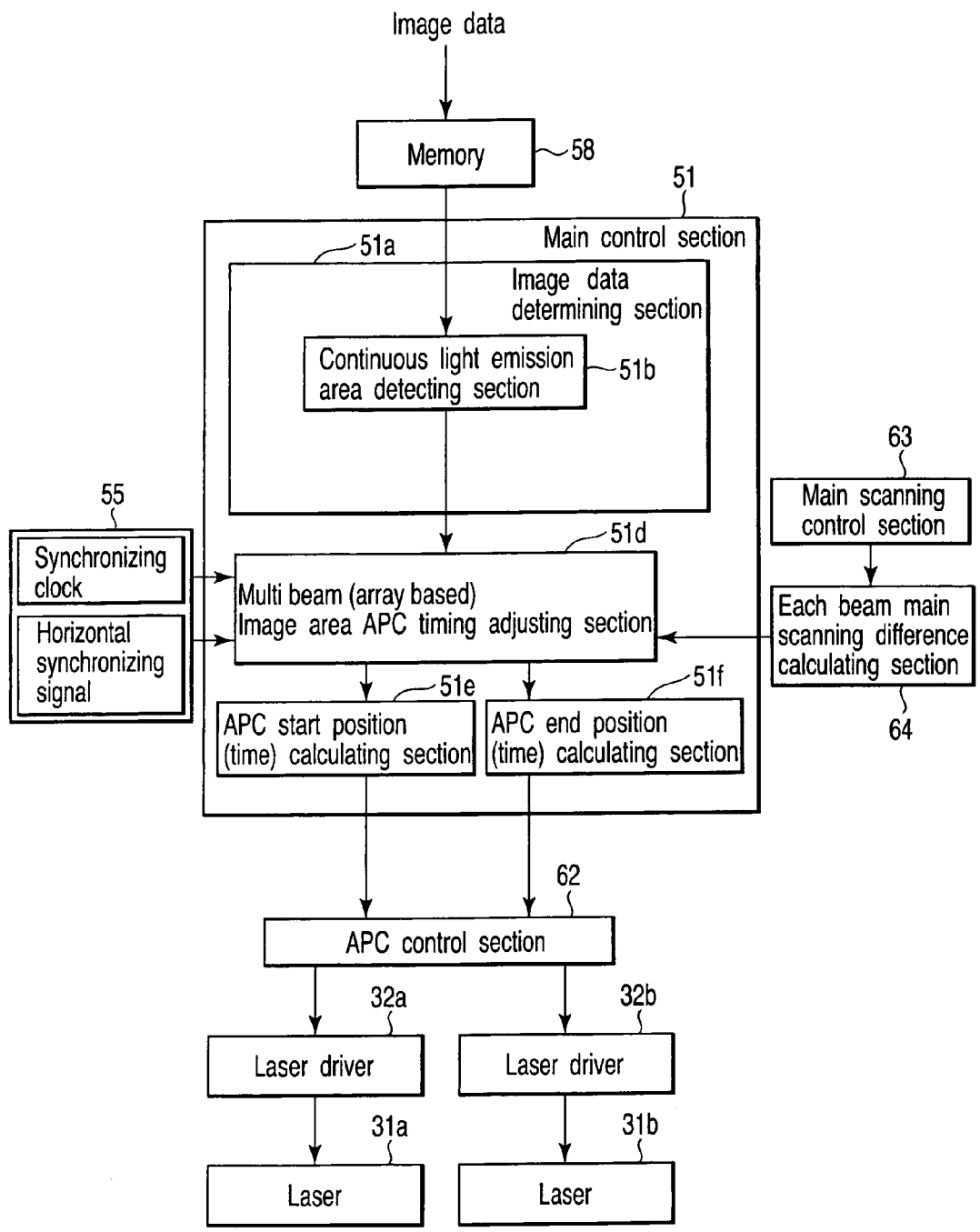
FIG. 6 is a control block diagram illustrating light quantity control performed by APC signals in the light beam scanning apparatus base on the array system.
Figure 7:
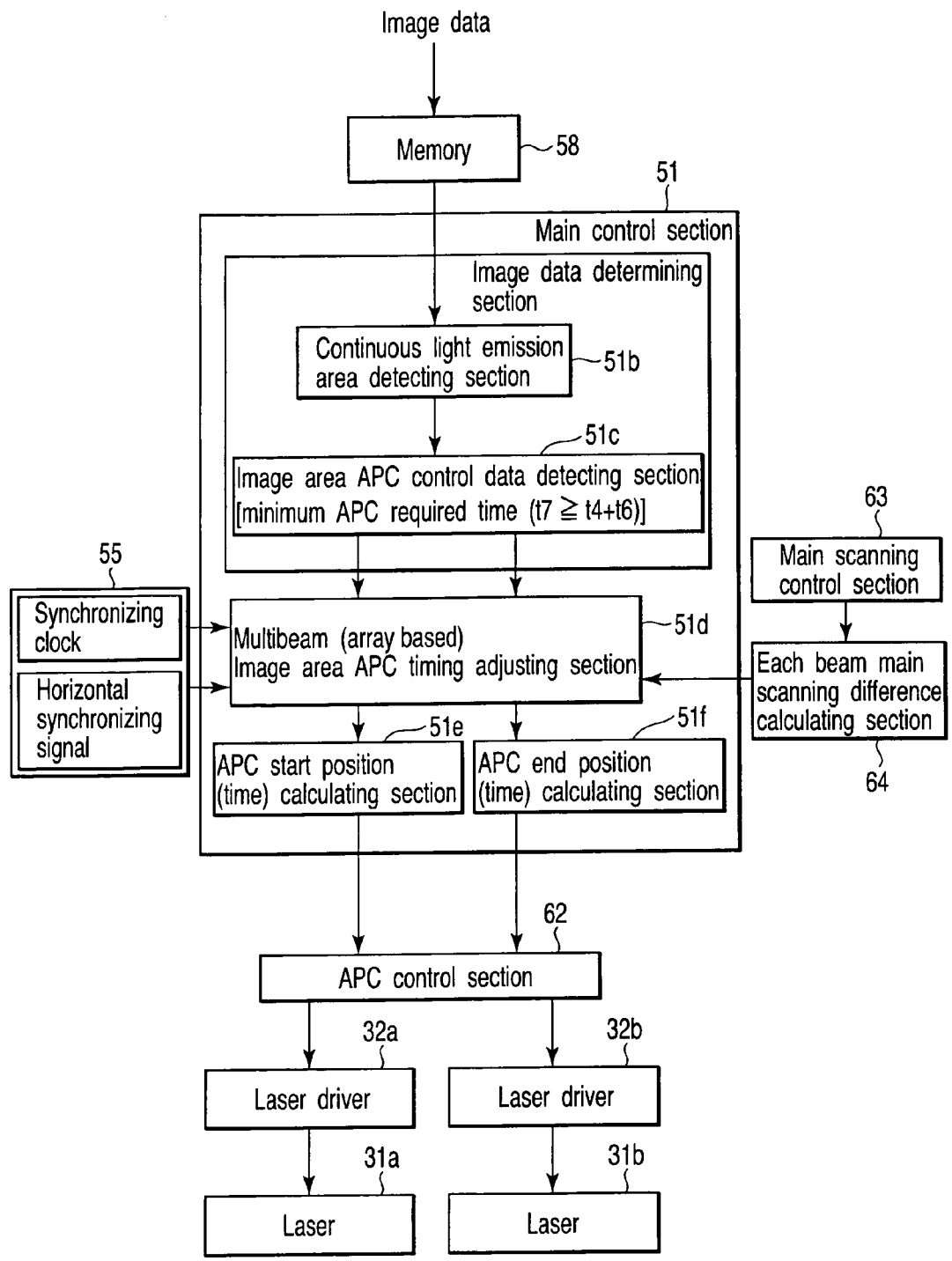
FIG. 7 is a control block diagram illustrating light quantity control performed by APC signals (corrected APC signals corrected taking a minimum continuous light emission period t7 into account) in the light beam scanning apparatus base on the array system.

FIG. 8A is a timing chart showing odd line image data and even line image data. FIG. 8B is a timing chart of APC signals output by the light beam scanning apparatus based on the individual system in association with the image data shown in FIG. 8A. FIG. 8C is a timing chart of APC signals output by the light beam scanning apparatus based on the array system in association with the image data shown in FIG. 8A. FIG. 8D is a timing chart of APC signals (corrected APC signals corrected taking the minimum continuous light emission period t7 into account) output by the light beam scanning apparatus based on the individual system in association with the image data shown in FIG. 8A. FIG. 8E is a timing chart of APC signals (corrected APC signals corrected taking the minimum continuous light emission period t7 into account) output by the light beam scanning apparatus based on the array system in association with the image data shown in FIG. 8A. FIG. 6 is a control block diagram illustrating light quantity control performed by the APC signals shown in FIG. 8C. FIG. 7 is a control block diagram illustrating light quantity control performed by the APC signals shown in FIG. 8E.

The light beam scanning apparatus based on the individual system shown in FIG. 2 outputs the APC signals shown in FIG. 8B in association with the image data shown in FIG. 8A. Specifically, the light beam scanning apparatus based on the individual system outputs an APC signal (APC-1) in association with an odd-line of the image data. The light beam scanning apparatus based on the individual system outputs an APC signal (APC-2) in association with an even-line of the image data.

The light beam scanning apparatus based on the array system shown in FIG. 3 outputs the APC signals shown in FIG. 8C in association with the image data shown in FIG. 8A. Specifically, the light beam scanning apparatus based on the array system outputs an APC signal (APC-1) in association with an odd-line of the image data. The light beam scanning apparatus based on the array system outputs an APC signal (APC-2) in association with an even-line of the image data. The light beam scanning apparatus based on the array system differs from the light beam scanning apparatus based on the individual system in that the APC signals are not output while the plurality of lasers are simultaneously emitting light but are output only while only one of the plurality of lasers is emitting light.

With the array system, the number of photodiodes is smaller than the number of lasers. In the light beam scanning apparatus shown in FIG. 3, the one photodiode 30 is installed for the two laser oscillators 31a and 31b. Accordingly, while the plurality of lasers are simultaneously emitting light, the level of light quantity detection carried out by the photodiode 30 is very high. Thus, if an attempt is made to perform APC while the two lasers are simultaneously emitting light, control is provided so as to extremely reduce the quantity of light. In other words, appropriate APC cannot be performed while the two lasers are simultaneously emitting light. Thus, APC is performed while only one of the two laser oscillators 31a and 31b is emitting light (on the basis of the detection of a difference in light emission timing for the two lasers in the main scanning direction).

Specifically, as shown in FIG. 6, a continuous light emission area is detected by a continuous light emission area detecting section 51b of an image data determining section 51a of the main control section 51. On this occasion, a continuous light emission area corresponding to the predetermined period (t0) or longer is detected as described in FIG. 4. Moreover, an image area APC timing adjusting section 51d adjusts the timings for APC signals so that APC is performed in association with the period in which only one laser is emitting light, on the basis of a synchronizing clock and a horizontal synchronizing signal provided by the synchronizing circuit 55 as well as the result of a calculation provided by an each beam main scanning difference calculating section 64. The period in which only one laser is emitting light in association with the image data is detected on the basis of the detection of a difference in light emission timing for the two lasers in the main scanning direction. The each beam main scanning difference calculating section 64 calculates the deviation of each beam in the main scanning direction on the basis of main scanning control performed by a main scanning control section 63.

An APC start position (time) calculating section 51e calculates an APC start position on the basis of the timing adjustment made by the image area APC timing adjusting section 51d. Likewise, an APC end position (time) calculating section 51f calculates an APC end position on the basis of the timing adjustment made by the image area APC timing adjusting section 51d. An APC control section 62 outputs APC signals to the APC circuits of the laser drivers 32a and 32b, respectively, on the basis of the result of calculation of the APC start position executed by the APC start position (time) calculating section 51e and the result of calculation of the APC end position executed by the APC end position (time) calculating section 51f. At this time, the APC signals shown in FIG. 8C are output.

Furthermore, the light beam scanning apparatus based on the individual system shown in FIG. 2 outputs the APC signals shown in FIG. 8C in association with the image data shown in FIG. 8A. Specifically, the light beam scanning apparatus based on the individual system outputs an APC signal (APC-1) in association with an odd-line of the image data. The light beam scanning apparatus based on the individual system outputs an APC signal (APC-2) in association with an even-line of the image data. The APC signals output in this case are corrected APC signals corrected taking the characteristics of a delay in the APC signal into account as shown in FIG. 5C. That is, before the laser starts emitting light in association with the image data, the main control section 51 detects a continuous light emission period longer than the minimum continuous light emission period (t7). The main control section 51 then outputs a corrected APC signal in association with the detected continuous light emission period.

The light beam scanning apparatus based on the array system shown in FIG. 3 outputs the APC signals shown in FIG. 8E in association with the image data shown in FIG. 8A. Specifically, the light beam scanning apparatus based on the array system outputs an APC signal (APC-1) in association with an odd-line of the image data. The light beam scanning apparatus based on the array system outputs an APC signal (APC-2) in association with an even-line of the image data. The APC signals output in this case are corrected APC signals corrected taking the characteristics of a delay in the APC signal into account as shown in FIG. 5C. Moreover, the corrected APC signals are output during the period in which only one of the plurality of lasers is emitting light in association with the image data and which is longer than the minimum continuous light emission period (t7).

Specifically, as shown in FIG. 7, a continuous light emission area is detected by the continuous light emission area detecting section 51b of the image data determining section 51a of the main control section 51. On this occasion, a continuous light emission area corresponding to the predetermined period (t0) or longer is detected as described in FIG. 4. Furthermore, an image area APC control data detecting section 51c detects a light emission period longer than the minimum continuous light emission period (t7). Moreover, the image area APC timing adjusting section 51d adjusts the timings for APC signals so that APC is performed in association with a period which is longer than the minimum continuous light emission period (t7) and in which only one laser is emitting light, on the basis of the synchronizing clock and horizontal synchronizing signal provided by the synchronizing circuit 55 as well as the result of the calculation provided by the each beam main scanning difference calculating section 64. The period in which only one laser is emitting light in association with the image data is detected on the basis of the detection of a difference in light emission timing for the two lasers in the main scanning direction.

The APC start position (time) calculating section 51e calculates an APC start position on the basis of the timing adjustment made by the image area APC timing adjusting section 51d. Likewise, the APC end position (time) calculating section 51f calculates an APC end position on the basis of the timing adjustment made by the image area APC timing adjusting section 51d. The APC control section 62 outputs APC signals to the APC circuits of the laser drivers 32a and 32b, respectively, on the basis of the result of calculation of the APC start position executed by the APC start position (time) calculating section 51e and the result of calculation of the APC end position executed by the APC end position (time) calculating section 51f. At this time, the APC signals shown in FIG. 8E are output.

Figure 9:
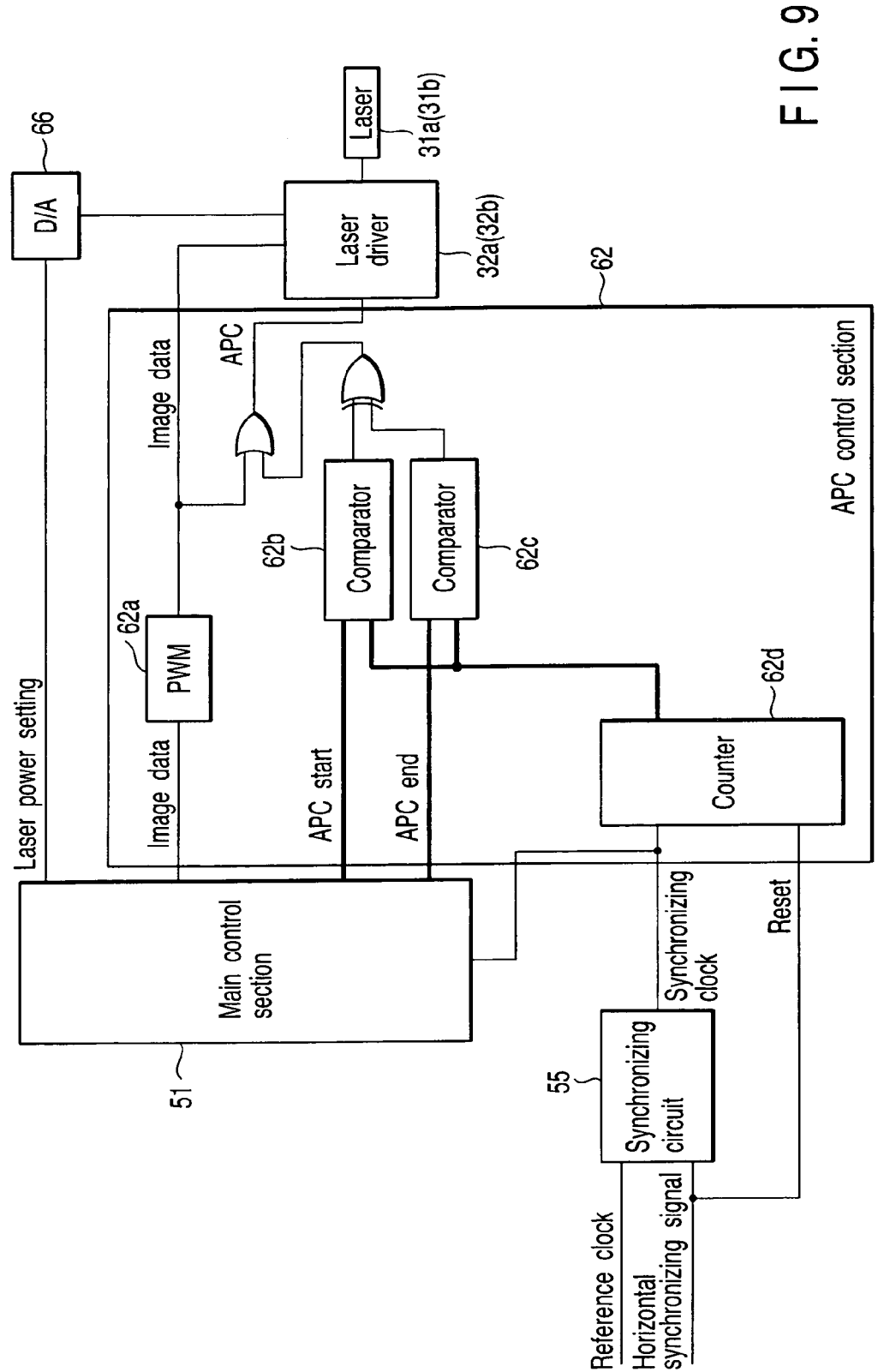
FIG. 9 is a diagram schematically showing an APC control section of a light beam scanning apparatus according to a first embodiment.

Now, the internal configuration of the APC control section 62 will be described with reference to FIG. 9. FIG. 9 is a diagram schematically showing the configuration of the APC control section 62. As shown in FIG. 9, the APC control section 62 comprises a pulse width modulator (PWM) 62a, comparators 62b and 62c, and a counter 62d. The pulse width modulator 62a generates a pulse signal corresponding to the image data. The comparator 62b outputs an APC start signal at a predetermined time with respect to the synchronizing signal (a delay time t4 earlier than the synchronizing signal). The comparator 62d outputs an APC end signal at a predetermined time with respect to the synchronizing signal (a delay time t6 earlier than the synchronizing signal). The counter 62d outputs a clock (synchronizing clock) reset by the horizontal synchronizing signal.

The above description relates to APC corresponding to the image area. However, it is possible to also use APC corresponding to a non-image area. Specifically, the main control section 51 controls the forces emission of the light beams at a predetermined time outside the period in which the light emission timing is controlled on the basis of the image data. The main control section 51 then performs first APC (APC for the area outside the image area) using APC signals based on the result of light quantity detection executed in association with the forced light emission. Moreover, as described above, the main control section 51 performs second APC (APC for the image area) using APC signals while the light emission timing is being controlled on the basis of the image data. The second APC is started utilizing the result of the first APC. That is, after controlling the quality of light in the light beams on the basis of the first APC, the main control section 51 starts controlling the light emission timing for the light beams on the basis of the image data and also performs the second APC.

Now, a second embodiment will be described with reference to FIGS. 1 to 3 and 10 to 17. The second embodiment is applicable to both single-beam light beam scanning apparatus and multibeam light beam scanning apparatus. For simplification of the description, a single-beam light beam scanning apparatus will be described below. In this case, the single-beam light beam scanning apparatus is assumed to comprise one laser oscillator 31, one photodiode 30 corresponding to the laser oscillator 31, and one laser driver 32 that drives the laser oscillator 31.

Figure 10:
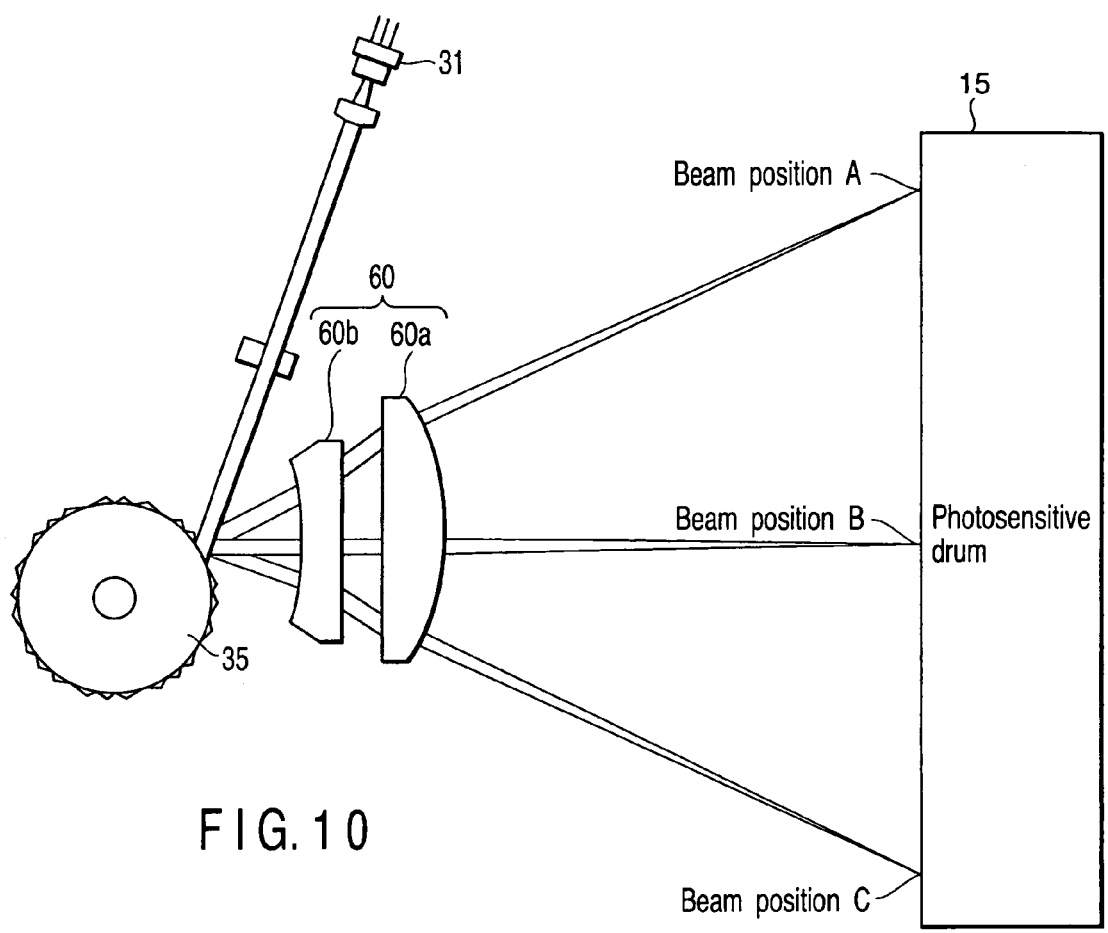
FIG. 10 is a view illustrating the effect of an fθ lens of the light beam scanning apparatus.
Figure 11:
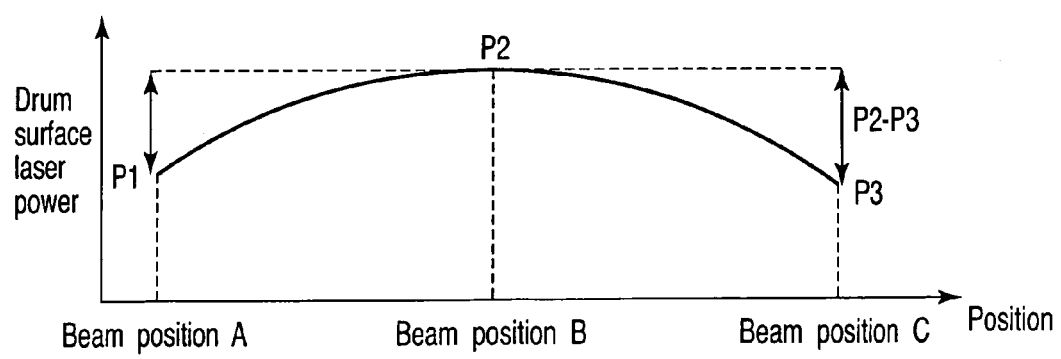
FIG. 11 is a chart showing a variation in the power of a light beam reaching a photosensitive drum, the variation being caused by the transmittance of the fθ lens.

FIG. 10 is a view illustrating the effect of the fθ lens of the light beam scanning apparatus. As shown in FIG. 10, the polygon mirror 35 is used to scan a light beam from the laser oscillator 31 over the photosensitive drum 15. The fθ lens 60 is located between the polygon mirror 35 and the photosensitive drum 15 to function as converting means for converting the conformal rate motion of the light beam into a uniform rate motion. The light beam entering the fθ lens 60 in accordance with the conformal rate motion branches to different paths upon passing through the fθ lens 60. As shown in FIG. 11, the power of (the quantity of light in) the light beam passing through the fθ lens 60 varies continuously under the effect of the different transmittances of the optical paths in the fθ lens 60. Specifically, the powers (P1 and P2) of light beams reaching a beam positions A and B, respectively, are lower than the power (P3) of a light beam reaching a beam position C.

Figure 12:
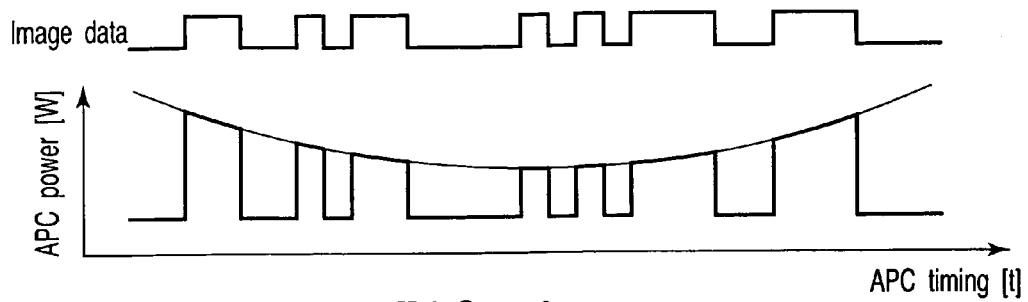
FIG. 12 is a chart showing how the power of a light beam is continuously controlled on the basis of laser power correction data when the power is continuously varied by the transmittance of the fθ lens.
Figure 14:
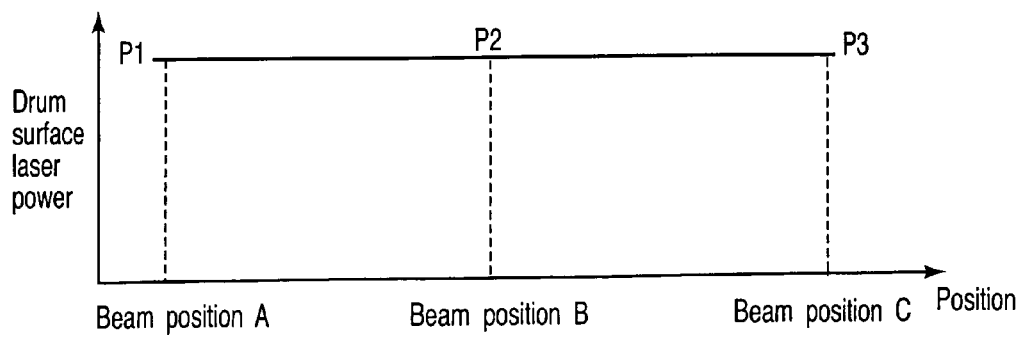
FIG. 14 is a chart showing how the beam power of a light beam reaching the photosensitive drum is kept fixed as a result of the continuous control of the power of the light beam based on the laser power correction data.

Thus, laser power correction data is acquired on the basis of the different transmittances of the optical paths in the fθ lens 60. For example, the memory 52 of the light beam scanning apparatus stores the laser power correction data. The main control section 51 controls the power of the laser oscillator 31 on the basis of the laser power correction data stored in the memory 52. For example, as shown in FIG. 12, the main control section 51 continuously controls the power of the light beam on the basis of the laser power correction data in association with a continuous variation in the power of (the quantity of light in) the light beam resulting from the transmittance of the fθ lens 60. As a result, as shown in FIG. 14, the powers of the light beams reaching the photosensitive drum 15 are kept fixed.

Alternatively, for example, the main control section 51 controls the power of the light beam step by step on the basis of the laser power correction data in association with a continuous variation in the power of the light beam resulting from the transmittance of the fθ lens 60. Specifically, one scanning line on the photosensitive drum 15 is divided into a plurality of areas. Then, laser power correction data is calculated for each area so as to average the light beam reaching the area (one laser power correction data is calculated for each area). Then, the power of the light beam applied to each area is controlled on the basis of the laser power correction data for the area. As a result, the power of the light beam reaching each area on the photosensitive drum 15 is averaged. Therefore, the powers of the light beams reaching the respective areas of the photosensitive drum 15 are averaged.

Figure 13:
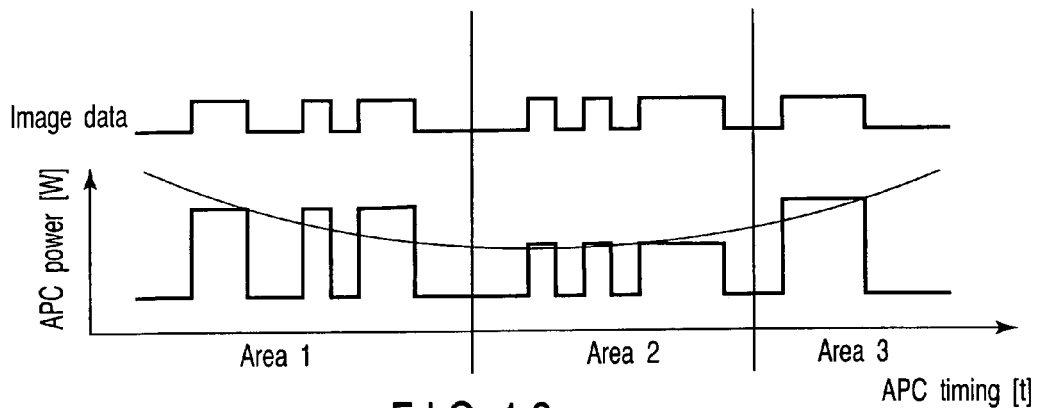
FIG. 13 is a chart showing how the power of a light beam is controlled step by step on the basis of laser power correction data when the power is continuously varied by the transmittance of the fθ lens.

For example, as shown in FIG. 13, one scanning line on the photosensitive drum 15 is divided into areas 1, 2, and 3. Laser power correction data set for the area 1 is used to control the power of the laser beam applied to the area 1 (one of the areas on the photosensitive drum 15) so as to average it. Likewise, laser power correction data set for the area 2 is used to control the power of the laser beam applied to the area 2 (one of the areas on the photosensitive drum 15) so as to average it. Similarly, laser power correction data set for the area 3 is used to control the power of the laser beam applied to the area 3 (one of the areas on the photosensitive drum 15) so as to average it. Thus, the light beam of the averaged power reaches all the areas of the photosensitive drum 15.

The above continuous power control enables the power of the light beam reaching the photosensitive drum to be accurately kept fixed. In contrast, the above step-by-step power control can be easily performed. Accordingly, for example, the costs of the apparatus can be reduced.

Figure 15:
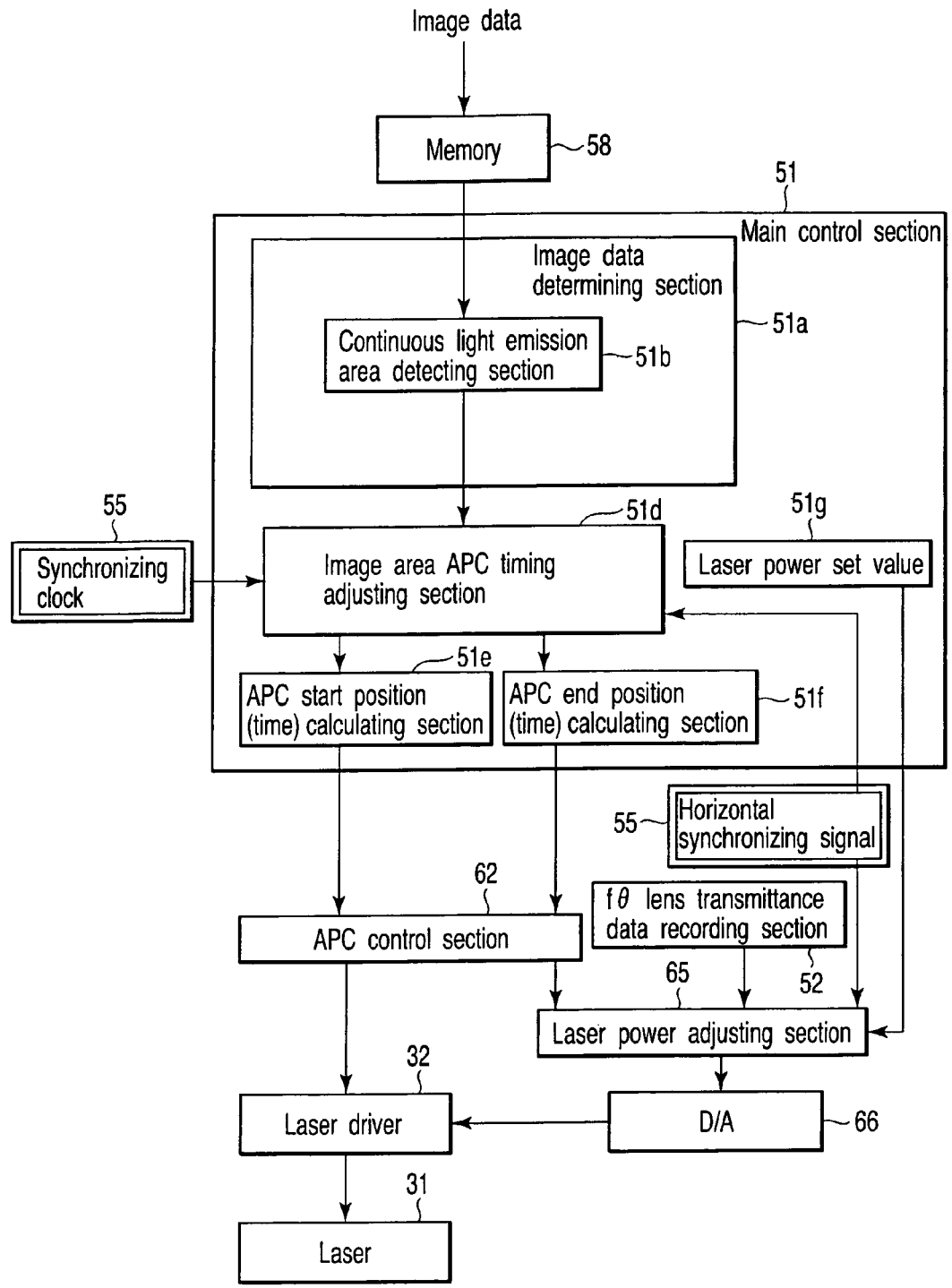
FIG. 15 is a control block diagram illustrating power control performed taking the impact of the transmittance of the fθ lens into account.

Specifically, as shown in FIG. 15, a continuous light emission area is detected by the continuous light emission area detecting section 51b of the image data determining section 51a of the main control section 51. On this occasion, a continuous light emission area corresponding to the predetermined period (t0) or longer is detected as described in FIG. 4. Moreover, the image area APC timing adjusting section 51d adjusts the timing for an APC signal on the basis of the synchronizing clock by the synchronizing circuit 55.

The APC start position (time) calculating section 51e calculates an APC start position on the basis of the timing adjustment made by the image area APC timing adjusting section 51d. Likewise, the APC end position (time) calculating section 51f calculates an APC end position on the basis of the timing adjustment made by the image area APC timing adjusting section 51d. The APC control section 62 outputs an APC signal to the APC circuit of the laser driver 32.

On the other hand, the laser power adjusting section 62 outputs laser power adjustment data on the basis of the laser power correction data from the fθ lens transmittance data recording section (memory) section, the horizontal synchronizing signal from the synchronizing circuit 55, and a default laser power set value 51g. The laser power adjustment data is input to the laser driver 32 via a digital-to-analog converter 66. The laser driver drives the laser oscillator 31 in accordance with APC performed at the predetermined time in association with the image data as well as the power control based on the transmittance of the fθ lens.

Figure 16:
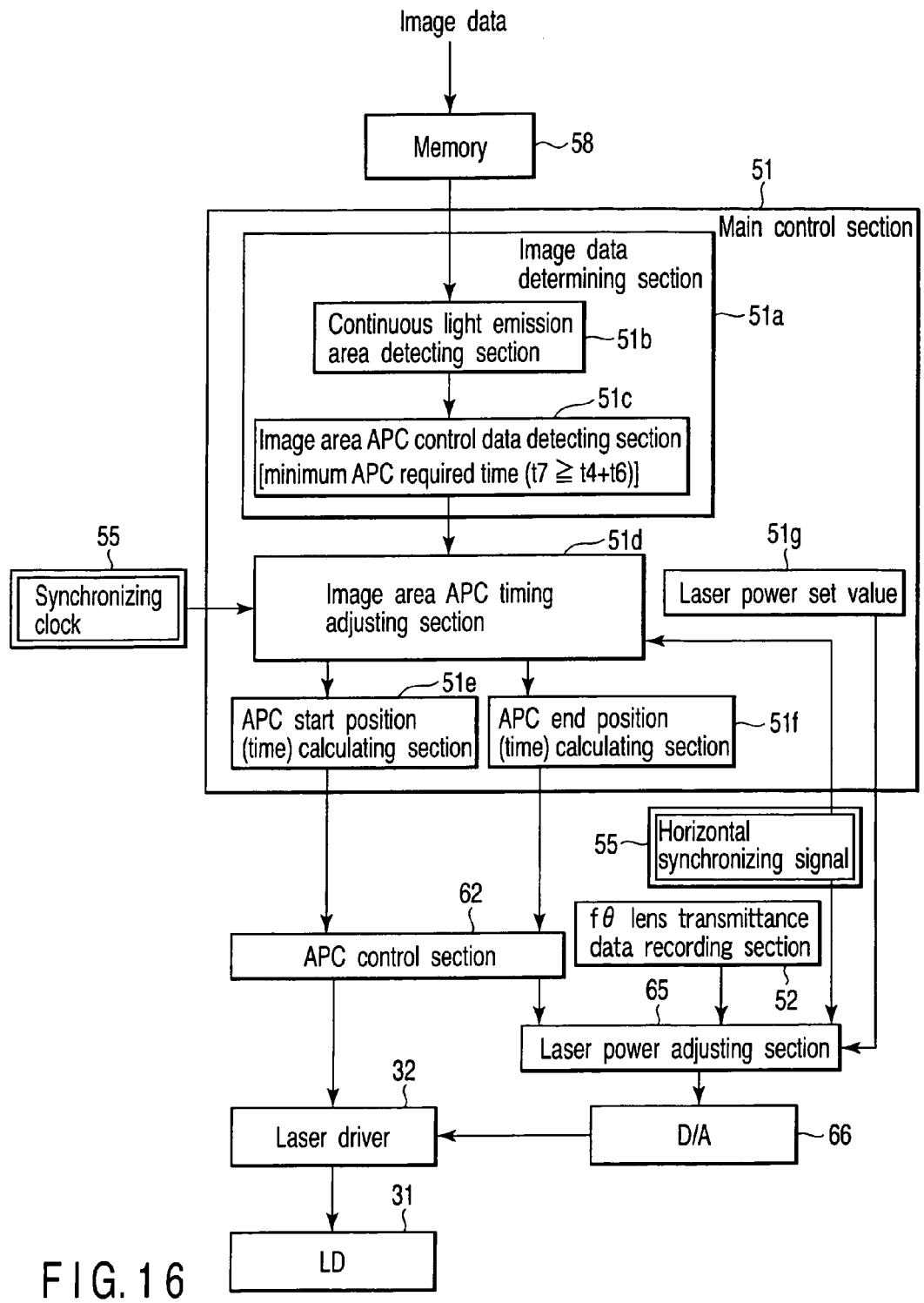
FIG. 16 is a control block diagram illustrating power control performed taking into account the impact of the transmittance of the fθ lens as well as the minimum continuous light emission period (t7)

Alternatively, control may be performed taking the minimum continuous light emission period (t7). Specifically, as shown in FIG. 16, a continuous light emission area is detected by the continuous light emission area detecting section 51b of the image data determining section 51a of the main control section 51. On this occasion, a continuous light emission area corresponding to the predetermined period (t0) or longer is detected. Furthermore, the image area APC control data detecting section 51c detects a light emission period longer than the minimum continuous light emission period (t7). Moreover, the image area APC timing adjusting section 51d adjusts the timing for an APC signal so that APC is performed in association with a period that is longer than the minimum continuous light emission period (t7), on the basis of the synchronizing clock provided by the synchronizing circuit 55.

The APC start position (time) calculating section 51e calculates an APC start position on the basis of the timing adjustment made by the image area APC timing adjusting section 51d. Likewise, the APC end position (time) calculating section 51f calculates an APC end position on the basis of the timing adjustment made by the image area APC timing adjusting section 51d. The APC control section 62 outputs an APC signal to the APC circuit of the laser driver 32 on the basis of the result of calculation of the APC start position executed by the APC start position (time) calculating section 51e and the result of calculation of the APC end position executed by the APC end position (time) calculating section 51f.

On the other hand, the laser power adjusting section 62 outputs laser power adjustment data on the basis of the laser power correction data from the fθ lens transmittance data recording section (memory) section, the horizontal synchronizing signal from the synchronizing circuit 55, and the default laser power set value 51g. The laser power adjustment data is input to the laser driver 32 via a digital-to-analog converter 66. The laser driver drives the laser oscillator 31 in accordance with APC performed at the predetermined time in association with the image data as well as the power control based on the transmittance of the fθ lens.

Figure 17:
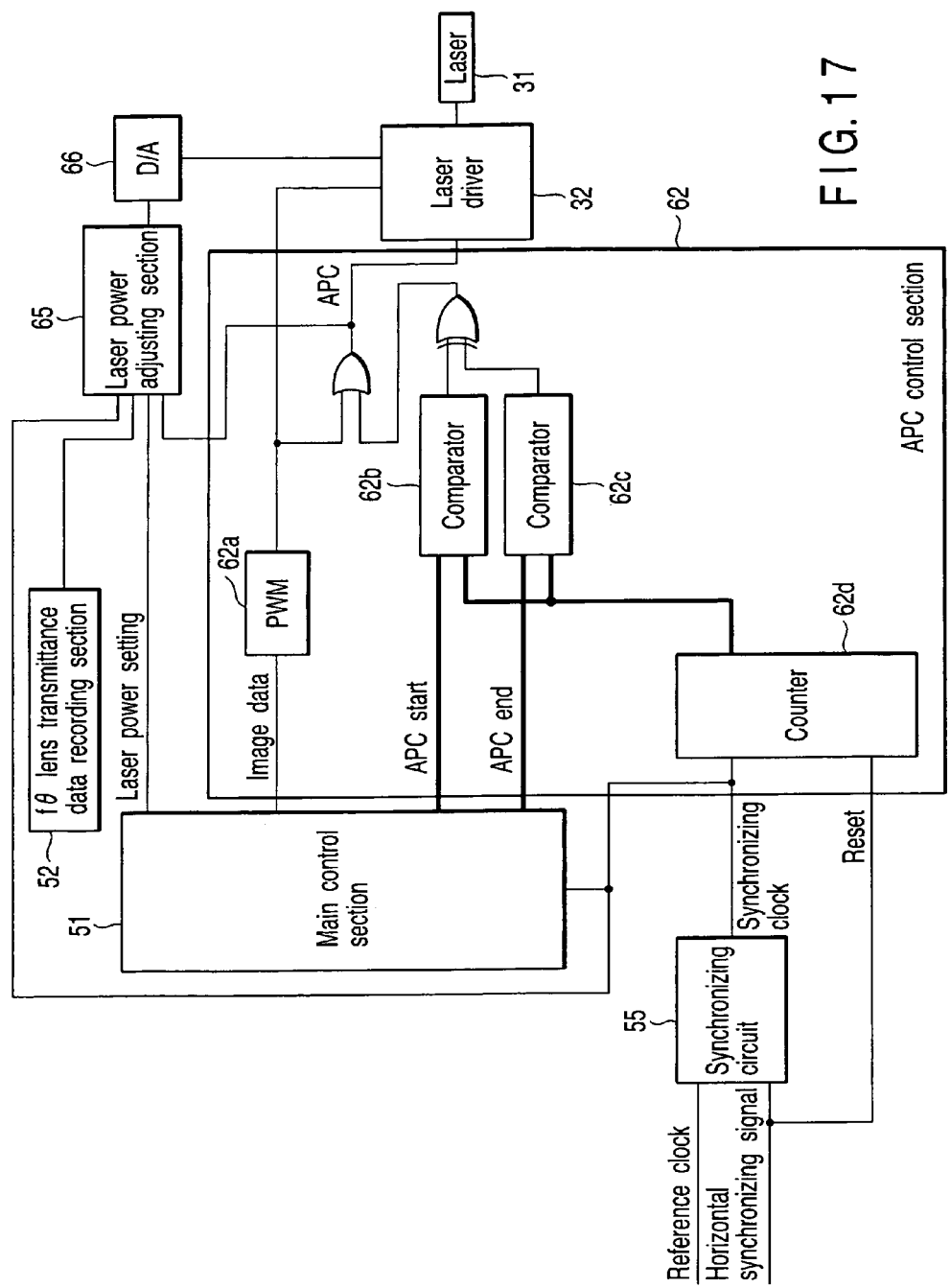
FIG. 17 is a diagram schematically showing the configuration of an APC control section of a light beam scanning apparatus according to a second embodiment.

FIG. 17 is a diagram schematically showing the configuration of the APC control section 62 of the light beam scanning apparatus according to the second embodiment. The basic configuration of the APC control section 62 shown in FIG. 17 is the same as the internal configuration of the APC control section 62 shown in FIG. 9. Thus, its detailed description is omitted.

The present invention makes it possible to provide a light beam scanning apparatus that enables the formation of an image with high quality. The present invention also makes it possible to provide an image forming apparatus that enables the formation of an image with high quality.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light beam scanning apparatus comprising:
   light emitting means for emitting a light beam;
   scanning control means for controlling scanning of the light beam emitted by the light emitting means;
   light quantity detecting means for detecting the quantity of light in the light beam emitted by the light emitting means;
   light quantity control signal output means for outputting a light quantity control signal that performs control such that the quantity of light in the light beam emitted by the light emitting means is kept fixed on the basis of a result of detection of the quantity of light in the light beam executed by the light quantity detecting means; and
   light emission control means for controlling a light emission timing for the light beam from the light emitting means on the basis of image data and controlling the quantity of light in the light beam emitted by the light emitting means on the basis of the light quantity control signal while the light emission timing is being controlled,
   wherein the light emission control means controls the quantity of light in the light beam emitted from the light emitting means on the basis of the light quantity control signal in association with a light emission period which corresponds to the control of the light emission timing for the light beam based on the image data and which lasts a predetermined period or longer, the light emission control means starts light quantity control based on the light quantity control signal at an appropriate time to compensate for delay, on the basis of a delay in start of light quantity control determined from characteristics of the light quantity control signal, and the light emission control means ends light quantity control based on the light quantity control signal at an appropriate time to compensate for delay, on the basis of a delay in end of light quantity control determined from characteristics of the light quantity control signal.

2. The light beam scanning apparatus according to claim 1, wherein the light emission control means performs first light quantity control which controls forced emission of the light beam from the light emitting means at a predetermined time outside the period in which the light emission timing is controlled on the basis of the image data and which controls the quantity of light in the light beam from the light emitting means on the basis of the light quantity control signal, and performs second light control which controls the light emission timing for the light beam on the basis of the image data and which controls the quantity of light in the light beam from the light emitting means on the basis of the light quantity control signal while the light emission timing is being controlled.

3. The light beam scanning apparatus according to claim 1, wherein the light emitting means includes a plurality of light sources which emit respective light beams,
   the scanning control means controls scanning of the plurality of light beams emitted by the respective light sources,
   the light quantity detecting means includes a plurality of light quantity detectors which individually detect the quantity of light in the respective light beams emitted by the corresponding light sources,
   the light quantity control signal output means outputs a plurality of light quantity control signals that perform control such that the quantity of light in the plurality of light beams emitted by the respective light sources is kept fixed on the basis of a plurality of results of detection of the quantity of light executed by the respective light quantity detectors, and
   the light emission control means controls light emission timings for the plurality of light beams from the respective light sources on the basis of image data and controls the quantity of light in the plurality of light beams emitted by the respective light sources on the basis of the light quantity control signal while the light emission timings are being controlled.

4. The light beam scanning apparatus according to claim 3, wherein the light emission control means controls the quantity of light in the plurality of light beams from the respective light sources on the basis of the light quantity control signal in association with a light emission period which corresponds to the control of the light emission timings for the plurality of light beams based on the image data and which last a predetermined period or longer.

5. The light beam scanning apparatus according to claim 1, wherein the light emitting means includes a plurality of light sources which emit respective light beams,
   the scanning control means controls scanning of the plurality of light beams emitted by the respective light sources,
   the light quantity detecting means includes a light quantity detector which detects the quantity of light in all of the plurality of light beams,
   the light quantity control signal output means outputs a light quantity control signal that performs control such that the quantity of light in the light beam emitted by only one of the plurality of light sources is kept fixed on the basis of a result of detection of the quantity of light executed by the light quantity detector while the only one light source is emitting the light beam, and
   the light emission control means controls light emission timings for the plurality of light beams from the respective light sources on the basis of image data and controls the quantity of light in the light beam emitted by the only one of the plurality of light sources on the basis of the light quantity control signal while the light emission timings are being controlled.

6. The light beam scanning apparatus according to claim 5, wherein the light emission control means controls the quantity of light in one light beam from the only one of the plurality of light sources on the basis of the light quantity control signal in association with a light emission period which corresponds to the light emission timing for the light beam based on the image data from the only one light source and which last a predetermined period or longer.

7. An image forming apparatus to which the light beam scanning apparatus according to claim 1 is applied, the image forming apparatus comprising:

image forming means for forming an image on the basis of a light beam with its light emission timing and quantity of light controlled by the light emission control means.

8. A light beam scanning apparatus comprising:

a light source configured to emit a light beam;

a scanning control unit configured to control scanning of the light beam emitted by the light source;

a light quantity detector configured to detect the quantity of light in the light beam emitted by the light source;

a light quantity control signal output configured to output a light quantity control signal that performs control such that the quantity of light in the light beam emitted by the light source is kept fixed on the basis of a result of detection of the quantity of light in the light beam executed by the light quantity detector; and a light emission controller configured to control a light emission timing for the light beam from the light source on the basis of image data and to control the quantity of light in the light beam emitted by the light source on the basis of the light quantity control signal while the light emission timing is being controlled, wherein the light emission controller is configured to control the quantity of light in the light beam emitted from the light source on the basis of the light quantity control signal in association with a light emission period which corresponds to the control of the light emission timing for the light beam based on the image data and which lasts a predetermined period or longer, the light emission controller starts light quantity control based on the light quantity control signal at an appropriate time to compensate for delay, on the basis of a delay in start of light quantity control determined from characteristics of the light quantity control signal, and the light emission controller ends light quantity control based on the light quantity control signal at an appropriate time to compensate for delay, on the basis of a delay in end of light quantity control determined from characteristics of the light quantity control signal.

* * * * *